United States Patent
Bates et al.

(10) Patent No.: US 7,721,186 B2
(45) Date of Patent: May 18, 2010

(54) REDUNDANCY PROTECTION FOR DATA RECORDED ACROSS MULTIPLE LAYERS OF RECORDING MEDIA

(75) Inventors: Allen Keith Bates, Tucson, AZ (US); Nils Haustein, Soergenlock (DE); Craig Anthony Klein, Tucson, AZ (US); Henry Zheng Liu, Tucson, AZ (US); Daniel James Winarski, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 1055 days.

(21) Appl. No.: 11/380,721

(22) Filed: Apr. 28, 2006

(65) Prior Publication Data

US 2007/0256000 A1    Nov. 1, 2007

(51) Int. Cl.
*H03M 13/00* (2006.01)
(52) U.S. Cl. .................. 714/784; 714/786
(58) Field of Classification Search ............. 714/752, 714/784, 786
See application file for complete search history.

(56) References Cited

U.S. PATENT DOCUMENTS

| | | | | |
|---|---|---|---|---|
| 5,280,488 | A * | 1/1994 | Glover et al. | 714/784 |
| 5,537,382 | A * | 7/1996 | McLaughlin et al. | 369/59.24 |
| 5,793,779 | A * | 8/1998 | Yonemitsu et al. | 714/764 |
| 6,026,122 | A * | 2/2000 | Kaku et al. | 375/265 |
| 6,029,264 | A * | 2/2000 | Kobayashi et al. | 714/755 |
| 6,370,091 | B1 | 4/2002 | Kuroda | |
| 6,370,097 | B1 | 4/2002 | Hayashi et al. | |
| 6,377,529 | B1 | 4/2002 | Lee et al. | |
| 6,516,443 | B1 | 2/2003 | Zook | |
| 7,237,173 | B2 * | 6/2007 | Morita et al. | 714/755 |
| 7,327,287 | B2 * | 2/2008 | Martinian et al. | 341/51 |
| 7,408,486 | B2 * | 8/2008 | Kilbank | 341/107 |
| 7,526,710 | B2 * | 4/2009 | Sawaguchi | 714/755 |
| 2004/0013074 | A1 | 1/2004 | Lee et al. | |
| 2004/0208106 | A1 | 10/2004 | Minemura | |
| 2004/0233815 | A1 | 11/2004 | Wong et al. | |
| 2005/0185542 | A1 | 8/2005 | Iwase | |

OTHER PUBLICATIONS

"White Paper: Blu-Ray Disc Format—1.A Physical Format Specifications for BD-RE", Aug. 2004, Blu-Ray Disc Founders.
"Channel Detection and Modulation Coding Techniques Used in Information Storage;" 2004 No. 3, 28-3; Mar. 12, 2004.

* cited by examiner

*Primary Examiner*—Esaw T Abraham
(74) *Attorney, Agent, or Firm*—Dan Shifrin

(57) ABSTRACT

To improve reliability for multi-layer media, a data stream U is received for recording to a multi-layer rotating storage medium, the data stream U comprising a sequence of data bits. Each data bit U(J) is encoded into X representation bits. A first representation bit B(1,J) is recorded onto a first layer of the storage media, the second representation bit B(2,J) is recorded onto a second layer of the storage media, etc. When a request to read the recorded data U from the storage media is subsequently received, a plurality of the X representation bits are read back from the storage media and are decoded into the original data bit U(J). One embodiment employs a convolution encoding algorithm and PRML decoding algorithm. Another embodiment employs Reed Solomon encoding/decoding.

21 Claims, 8 Drawing Sheets

REDUNDANCY PROTECTION FOR DATA RECORDED ACROSS MULTIPLE LAYERS OF RECORDING MEDIA

TECHNICAL FIELD

The present invention relates generally to recording data to and reading data from multi-layer, rotating data storage media and, in particular, to reducing the risk of loss or inaccessibility of data in the event that data on one or more layers is unreadable.

BACKGROUND ART

Rotating data storage media having multiple recording layers is one method which is employed to increase the amount of data that can be stored in a given volume. As used herein, the term "layer" refers broadly to the recording surfaces of a stack of disk platters secured to a single spindle as well as to recording layers embedded within a single piece of media. FIG. 1 is an example of the former, a hard disk stack 100 with four platters 110, 120, 130, 140. Each platter 110, 120 has two recording surfaces, 110A and 110B, 120A and 120B, 130A and 130B, and 140A and 140B, respectively. As is known, the platters are secured to a spindle 150 and rotate together. FIG. 2 is an example of the latter, a cross-section of a multi-layer optical disc 200 having four recordable layers 210A, 210B, 210C, 210D embedded therein between spacer layers. Multi-layer optical disk 200 may be a DVD (Digital Versatile Disk), HD-DVD (High Definition DVD) disk, or a Blu-Ray disk. The layers are accessed optically via laser 220. Data is typically initially recorded in sequential blocks, continuing from one layer to the next. In a re-writable environment, as data is modified or overwritten, blocks with new data may become more spread out to fill gaps left by old, erased or moved data.

While increasing data density by recording to multi-layer media provides many benefits, some data may be at risk if part or all of a layer becomes unreadable, such as from a scratch, media defect, head crash or aging, among others. Consequently, a need remains for improving the reliability of multi-layer media and, therefore, the security of the data recorded thereon.

SUMMARY OF THE INVENTION

The present invention improves reliability for multi-layer media by providing a method, a data storage device and a computer program product for recording data to and reading data from multiple layers of rotating storage media. According to the method of the present invention, a data stream U is to be recorded to rotating storage media having a plurality L of recordable layers, the data stream U comprising a sequence of data bits where $U(J)$ represents the $J^{th}$ bit in the data stream U. The data stream U is received and each data bit $U(J)$ is encoded into X representation bits $B(1,J), B(2,J), \ldots B(X,J)$. The first representation bit $B(1,J)$ is recorded onto a first layer of the storage media, the second representation bit $B(2,J)$ is recorded onto a second layer of the storage media, and remaining representation bits are recorded onto layers of the storage media. A request to read the recorded data U from the storage media is subsequently received and a plurality of the X representation bits $B(1,J), B(2,J), \ldots B(X,J)$ are read back from the storage media. The plurality of X representation bits $B(1,J), B(2,J), \ldots B(X,J)$ are then decoded into the original data bit $U(J)$. In one embodiment, encoding may be performed with a convolution encoding algorithm and decoding with a PRML decoding algorithm. In another embodiment, Reed Solomon encoding/decoding may be employed.

The data storage device of the present invention includes a data input coupled to receive a data stream U to be recorded to rotating storage media having a plurality L of recordable layers, the data stream U comprising a sequence of data bits where $U(J)$ represents the $J^{th}$ bit in the data stream U. The storage device further includes an encoder for encoding each data bit $U(J)$ into X representation bits $B(1,J), B(2,J), \ldots B(X,J)$ and means for recording the first representation bit $B(1,J)$ onto a first layer of the storage media, recording the second representation bit $B(2,J)$ onto a second layer of the storage media, and recording remaining representation bits onto layers of the storage media. The storage device also includes a command input for receiving a request to read the recorded data U from the storage media, means for reading back a plurality of the X representation bits $B(1,J), B(2,J), \ldots B(X,J)$ from the storage media, and a decoder for decoding the plurality X representation bits $B(1,J), B(2,J), \ldots B(X,J)$ into the original data bit $U(J)$. In one embodiment, the encoder is a convolution encoder and the decoder is a PRML decoder. In another embodiment, the encoder and decoder are a Reed Solomon encoder and decoder, respectively.

The computer program product of the present invention includes a computer readable medium having computer-readable code comprising instructions for receiving a data stream U to be recorded to rotating storage media having a plurality L of recordable layers, the data stream U comprising a sequence of data bits where $U(J)$ represents the $J^{th}$ bit in the data stream U, encoding each data bit $U(J)$ into X representation bits $B(1,J), B(2,J), \ldots B(X,J)$, recording the first representation bit $B(1,J)$ onto a first layer of the storage media, recording the second representation bit $B(2,J)$ onto a second layer of the storage media, and recording remaining representation bits onto layers of the storage media, receiving a request to read the recorded data U from the storage media, reading back a plurality of the X representation bits $B(1,J), B(2,J), \ldots B(X,J)$ from the storage media, and decoding the plurality of X representation bits $B(1,J), B(2,J), \ldots B(X,J)$ into the original data bit $U(J)$.

BRIEF DESCRIPTION OF THE DRAWINGS

FIG. 8 illustrates a data storage device 800 of the present invention. The data storage device 800 includes a data input 802 coupled to receive from a host device 10 a data stream U to be recorded to rotating storage media 820 having a plurality L of recordable layers, the data stream U comprising a sequence of data bits where U(J) represents the $J^{th}$ bit in the data stream U. The storage device 800 further includes an encoder 804 for encoding each data bit U(J) into X representation bits B(1,J), B(2,J), ... B(X,J) and a module 806 for recording the first representation bit B(1,J) onto a first layer of the storage media 820, recording the second representation bit B(2,J) onto a second layer of the storage media 820, and recording remaining representation bits onto layers of the storage media 820. The storage device 800 also includes a command input 808 for receiving a request from the host device 10 to read the recorded data from the storage media 820, a module 810 for reading back a plurality of the X representation bits B(1,J), B(2,J), ... B(X,J) from the storage media 820, and a decoder 812 for decoding the plurality X representation bits B(1,J), B(2,J), ... B(X,J) into the original data bit U(J). In one embodiment, the encoder 804 is a convolution encoder and the decoder 812 is a PRML decoder. In another embodiment, the encoder 804 and decoder 812 are a Reed Solomon encoder and decoder, respectively.

DETAILED DESCRIPTION OF THE PREFERRED EMBODIMENT

Figure 1:
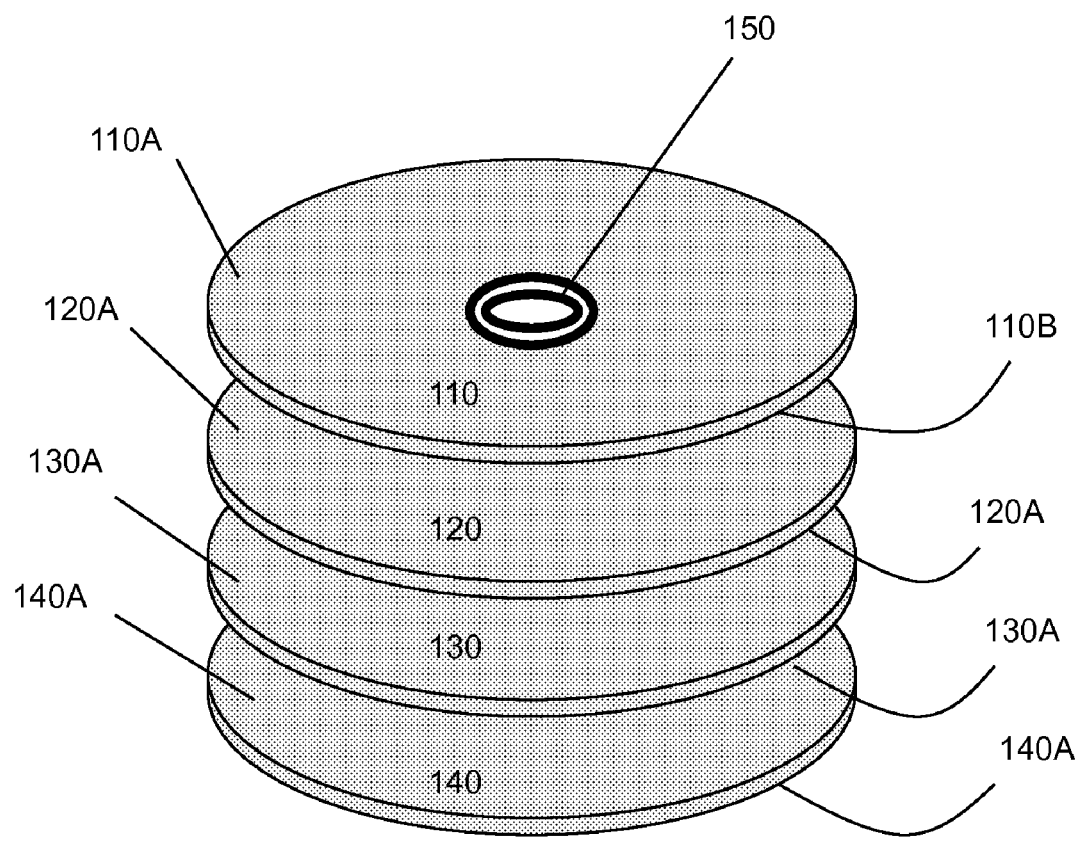
FIG. 1 illustrates a prior art hard disk stack with which the present invention may be used.
Figure 2:
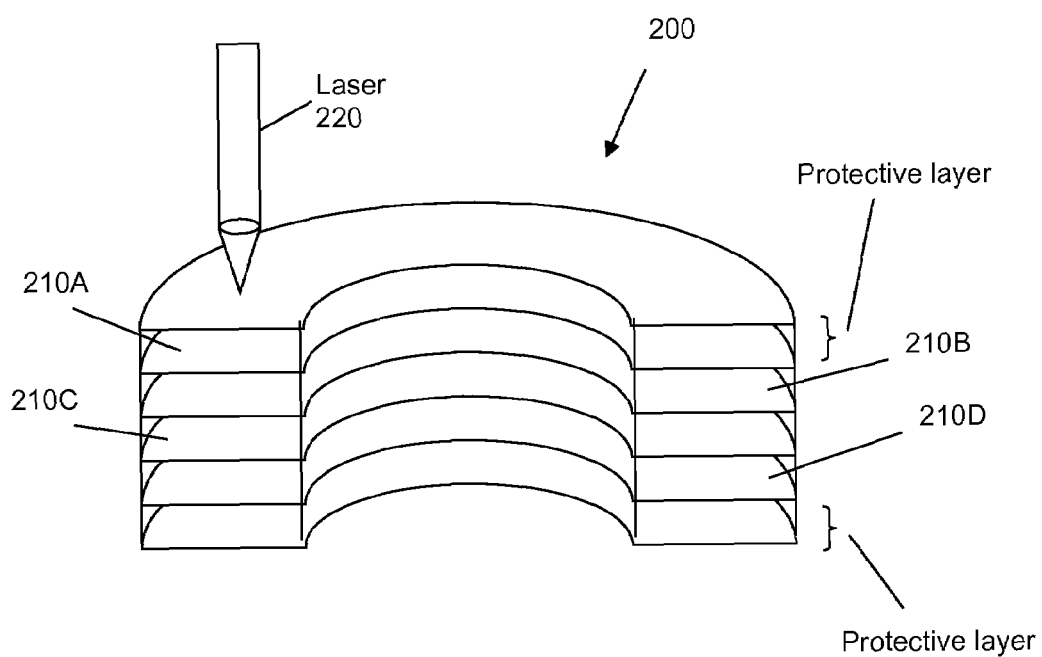
FIG. 2 illustrates a prior art multi-layer optical disc with which the present invention may be used.

A data stream U from a host to be recorded onto a multi-layer rotating storage media (which, as noted above, may be a single piece of media with a number L embedded recording layers or individual disks connected in a stack) comprises a sequence of data bits U(1) ... U(J). Conventionally, the data bits would be recorded sequentially beginning on one layer and, if necessary, continuing onto one or more additional layers. However, in accordance with the present invention, the data bits are encoded into representation bits and recorded onto multi-layer media with the first representation bit being recorded onto the first layer, the second representation bit being recorded onto the second layer, the third representation bit being recorded onto the third layer, and continuing until the $L^{th}$ representation bit has been recorded onto the $L^{th}$ layer. The next representation bit is then recorded onto the first layer and the process continues until all of the representation bits have been recorded to the storage media.

TABLE I illustrates the sequence in which representation bits are recorded to bit positions on storage media having four layers, L1-L4.

TABLE I

| Disk Layer Number | Encoded at Time = 1 | Encoded at Time = 2 | Encoded at Time = 3 | |
| --- | --- | --- | --- | --- |
| L1 | L(1,1) | L(1,2) | L(1,3) | ... |
| L2 | L(2,1) | L(2,2) | L(2,3) | ... |
| L3 | L(3,1) | L(3,2) | L(3,3) | ... |
| L4 | L(4,1) | L(4,2) | L(4,3) | ... |

At time T=1, the first four representation bits are encoded, simultaneously or in rapid succession, to the first position in each of the four layers L(1,1), L(2,1), L(3,1), L(4,1), as shown in the first data column of TABLE I. During the next time window T=2, the next four representation bits are encoded to the second position in each of the four layers L(1,1), L(2,1), L(3,1), L(4,1), as shown in the second data column of TABLE I. During, at the next time window T=3, the next four representation bits are encoded to the third position in each of the four layers L(1,1), L(2,1), L(3,1), L(4,1), as shown in the third data column of TABLE I. After the representation bits are encoded and stored in a buffer, as shown in TABLE I, the representation bits are generally written by layer (to avoid the laser having to unnecessarily jump among layers), indicated by the rows of TABLE I, where layer j receives bits L(j,1) to bits L(j,N), then layer k receives bits L(k,1) to bits L(k,N).

When the host requests the data U to be read back from the storage media, the representation bits are read, generally by layer, where bits L(j,1) to bits L(j,N), are read from layer j, and then bits L(k,1) to bits L(k,N) are read by layer k. The bits may then be buffered and re-assembled into TABLE I and decoded into the original data stream U(1) ... U(J). Damage or other inability to read from an area of one layer will only affect some of the representation bits and, by employing further features of the present invention, data may be reconstructed despite the loss of some representation bits.

In one embodiment of the present invention, each data bit U(1) ... U(J) is convolution encoded into a predetermined number of representation bits. For example, each data bit K may be convolution encoded into the same number of representation bits as there are recording layers (L): B(1,K), B(2,K), ... , B(L,K). Alternatively, each data bit K may be convolution encoded into the twice as many representation bits as there are recording layers (L): B(1,K), B(2,K), ... , B(2*L,K). The first L representation bits are recorded onto the L layers as are the second L representation bits. Generally, each data bit K may be convolution encoded into a number X of representation bits equal to an integer multiple M times the number of recording layers (L): B(1,K), B(2,K), ... , B(M*L=X,K).

In an alternate embodiment, the number of layers is an integral number of the bits encoded by the convolution encoder. For example, the convolution encoder in FIG. 4 generates four representational bits at a given time. Thus, in an eight layer disk or stack of disks, four bits may be recorded onto the first four layers and the second four bits may be recorded onto the second four layers, before repeating the process for the next sets of bits.

Figure 3:
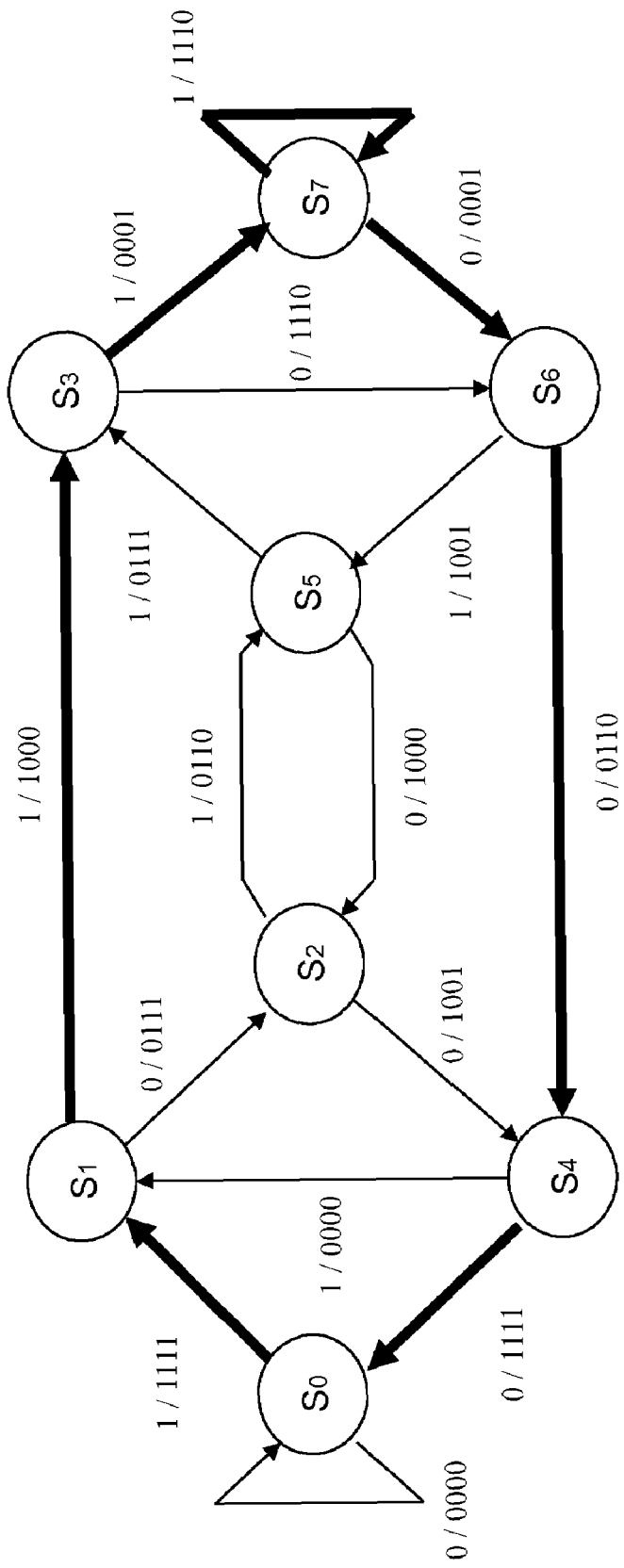
FIG. 3 is an example of a state diagram which may be used to implement an encoder in accordance with the present invention.

TABLE II and the state diagram of FIG. 3 illustrate an example of convolution encoding a data bit U into X=4 representation bits to be recorded onto L=4 recording layers. Column 1 of TABLE II contains the possible initial states (eight in the illustration), column 2 contains the possible destination states for each initial state, column 3 contains the two states of an original data bit U, and column 4 contains an encoded "word" comprising the four output representation bits to be recorded onto the four layers of the recording media.

TABLE II

| Initial State | Destination State | Original Data U | Encoded Data By Layer L1, L2, L3, L4 |
| --- | --- | --- | --- |
| S0 | S0 | 0 | 0000 |
| S0 | S1 | 1 | 1111 |
| S1 | S2 | 0 | 0111 |
| S1 | S3 | 1 | 1000 |
| S2 | S4 | 0 | 1001 |
| S2 | S5 | 1 | 0110 |
| S3 | S6 | 0 | 1110 |
| S3 | S7 | 1 | 0001 |
| S4 | S0 | 0 | 1111 |
| S4 | S1 | 1 | 0000 |
| S5 | S2 | 0 | 1000 |
| S5 | S3 | 1 | 0111 |
| S6 | S4 | 0 | 0110 |
| S6 | S5 | 1 | 1001 |
| S7 | S6 | 0 | 0001 |
| S7 | S7 | 1 | 1110 |

Figure 4:
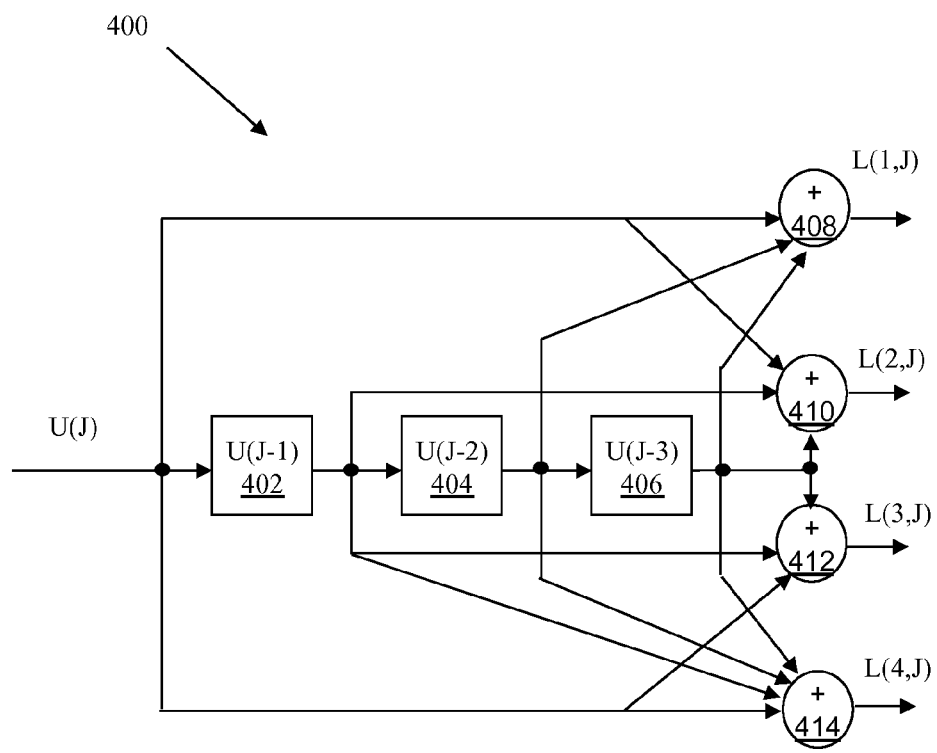
FIG. 4 is a block diagram of one example of a convolution encoder which may be implemented in the present invention.

FIG. 4 is a block diagram of a convolution encoder 400 which maybe used to implement the present invention. FIG. 4 may be implemented directly into a semiconductor chip or may be implemented in software. The encoder 400 includes a three-stage shift register comprising first, second and third registers 402, 404, 406 coupled in series. It are these three shift registers which give rise to the eight states in TABLE II and FIG. 3, namely by raising two (binary arithmetic) to the number of shift registers; in the illustrated example, two to the third power (three shift registers). The encoder 400 further includes first, second, third and fourth modulo-2 adders 408, 410, 412, 414 which may be implemented as exclusive-OR (XOR) logic gates. The input data stream U(J) is coupled to input of the first register 402 and inputs of the first, second, third and fourth adders 408, 410, 412, 414. The output (U(J-1)) of the first register 402 is coupled to the input of the second register 404 and to inputs of the second, third and fourth adders 410, 412, 414. The output (U(J-2)) of the second register 404 is coupled to the input of the third register 406 and to inputs of the first and fourth adders 408, 414. The output (U(J-3)) of the third register 406 is coupled to inputs of the first, second, third and fourth adders 408, 410, 412, 414.

In operation, the initial contents of the registers 402, 404, 406 is typically 0. An input data bit U(J) and the outputs of the registers 402, 404, 406 are selectively added by the adders 408, 410, 412, 414. The first adder 408 generates and outputs the first representation bit B(1,J); the second adder 410 generates and outputs the second representation bit B(2,J); the third adder 412 generates and outputs the third representation bit B(3,J); and, the fourth adder 414 generates and outputs the fourth representation bit B(4,J). As illustrated, the encoder 400 comprises a feed forward shift register. It will be appreciated that the convolution encoder 400 may be implemented in other ways. Moreover, the encoding throughput may be increased by encoding multiple data bits in parallel.

Figure 5:
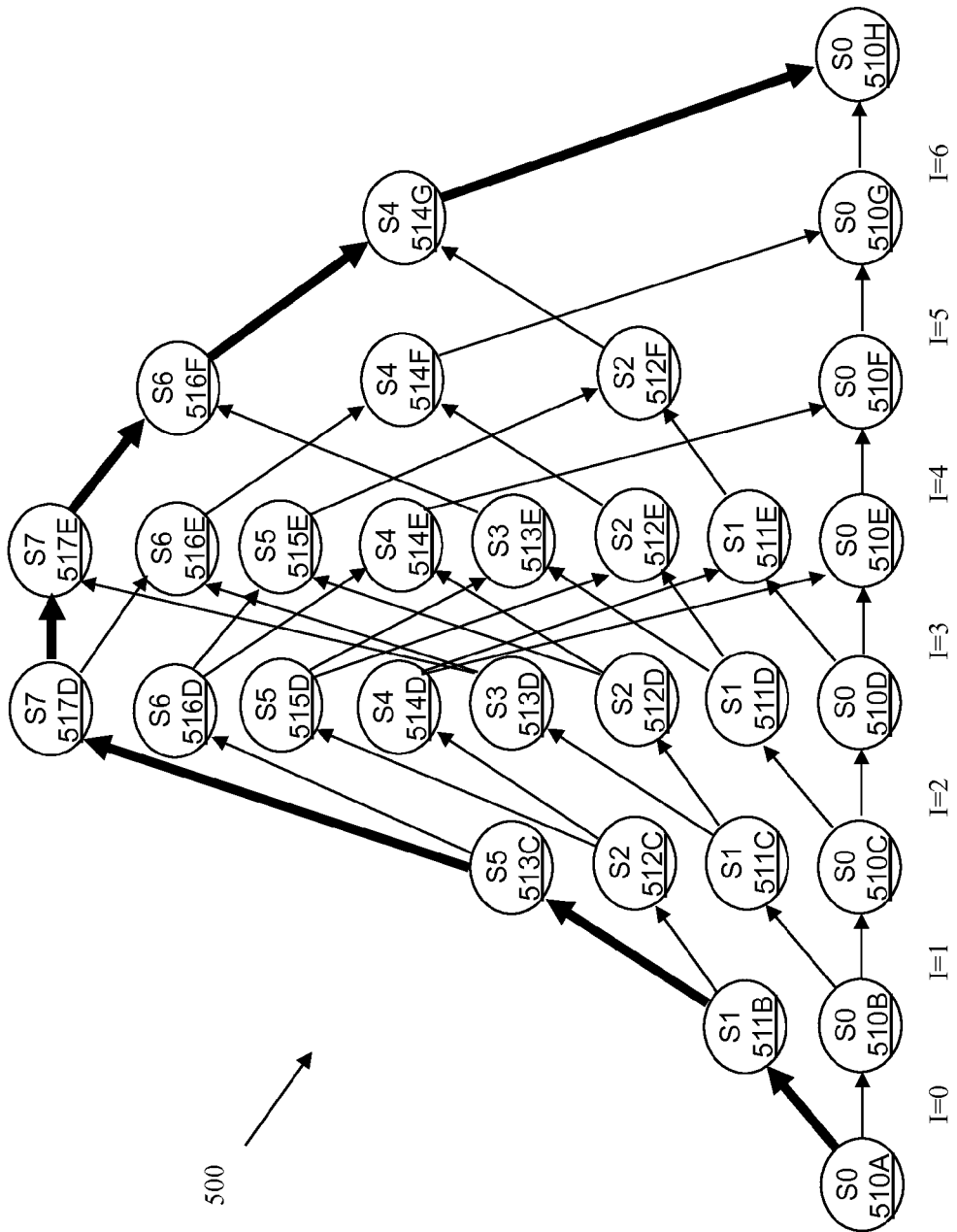
FIG. 5 is an example of trellis diagram which may be used to implement a decoder in accordance with the present invention.

FIG. 5 is an example of trellis diagram which may be used to implement a partial-response, maximum-likelihood (PRML) decoder in accordance with the present invention. States $S_0$-$S_7$ are shown in FIG. 5, and it is assumed that the initial contents of the registers 402, 404, 406 are zero; the trellis diagram 500 therefore begins at state $S_0$ 510A. From $S_0$ 510A, a path through the trellis diagram 500 jumps to either $S_0$ 510B or $S_1$ 511B. The increase from suffix A to suffix B in the numbering of the states in the trellis diagram 500 is called a branch, and the branch index I is zero when jumping from suffix A to suffix B. From $S_0$ 510B, the path jumps to either $S_0$ 510C or $S_1$ 511C and from $S_1$ 511B, jumps to either $S_2$ 512C or $S_3$ 513C, and the branch index I is 1. From $S_0$ 510C, the path jumps to either $S_0$ 510D or $S_1$ 511D, from $S_1$ 511C jumps to either $S_2$ 512D or $S_3$ 513D, from $S_2$ 512C jumps to either $S_4$ 514D or $S_5$ 515D, or from $S_3$ 513C jumps to either $S_6$ 516D or $S_7$ 517D, and the branch index I is 2.

The next series of jumps in the path through the trellis diagram 500 show the full breath of the decoding effort. From $S_0$ 510D, the path jumps to either $S_0$ 510E or $S_1$ 511E, from $S_1$ 511D jumps to either $S_2$ 512E or $S_3$ 513E, from $S_2$ 512D jumps to either $S_4$ 514E or $S_5$ 515E, or from $S_3$ 513D jumps to either $S_6$ 516E or $S_7$ 517E, and the branch index I is 3. Also, from $S_7$ 517D, the path jumps to either $S_7$ 517E or $S_6$ 516E, from $S_6$ 516D jumps to either $S_5$ 515E or $S_4$ 514E, from $S_5$ 515D jumps to either $S_3$ 513E or $S_2$ 512E, or from $S_4$ 514D jumps to either $S_1$ 511E or $S_0$ 510E.

Typically, what is shown for branch index I=3 is repeated a plurality of times in a trellis diagram. However, for brevity, only one such iteration is shown in FIG. 5. For the rest of FIG. 5, the trellis diagram is shown to conclude, indicating the ending of the decoding process. From $S_0$ 510E, the path jumps only to $S_0$ 510F, from $S_1$ 511E the jumps only to $S_2$ 512F, from $S_2$ 512E jumps only to $S_4$ 314F, and from $S_3$ 513E jumps only to $S_6$ 516F, and the branch index I is 4. Also, from $S_7$ 517E, the path jumps only to $S_6$ 516F, from $S_6$ 516E jumps only to $S_4$ 514F, from $S_5$ 515E jumps only to $S_2$ 512F, and from $S_4$ 514E jumps only to $S_0$ 510F. From $S_0$ 510F, the path jumps only to $S_0$ 510G, and from $S_2$ 512F jumps only to $S_4$ 514G, and the branch index I is 5. Also, from $S_6$ 516F, the path jumps only to $S_4$ 514G, and from $S_4$ 514F jumps only to $S_0$ 510G. Finally, from $S_0$ 510G, the path jumps only to $S_0$ 510H; and the branch index I is 6. Also, from $S_4$ 514G, the path jumps only to $S_0$ 510H.

In TABLE III, the encoded data is shown for the highlighted encoding path in the state diagram of FIG. 3 ($S_0$, $S_1$, $S_3$, $S_7$, $S_7$, $S_6$, $S_4$ and $S_0$) for the given example of encoding of 1111000 into representation bits for the four (in this example) layers L1, L2, L3, L4. TABLE III also shows the decoded data for the highlighted decoding path in the trellis diagram of FIG. 5. Thus, TABLE III can be considered to be a encoding-decoding (ENDEC) table, where the first column is the initial state, the second column is the destination state, the third column contains the original serial data U, and the fourth column presents the encoded data for disk layers L1, L2, L3 and L4.

TABLE III

| Initial State | Destination State | Original Data U | Encoded Data Array (L1, L2, L3, L4) |
|---|---|---|---|
| S0 | S1 | 1 | 1111 |
| S1 | S3 | 1 | 1000 |
| S3 | S7 | 1 | 0001 |
| S7 | S7 | 1 | 1110 |
| S7 | S6 | 0 | 0001 |
| S6 | S4 | 0 | 0110 |
| S4 | S0 | 0 | 1111 |

Figure 6:
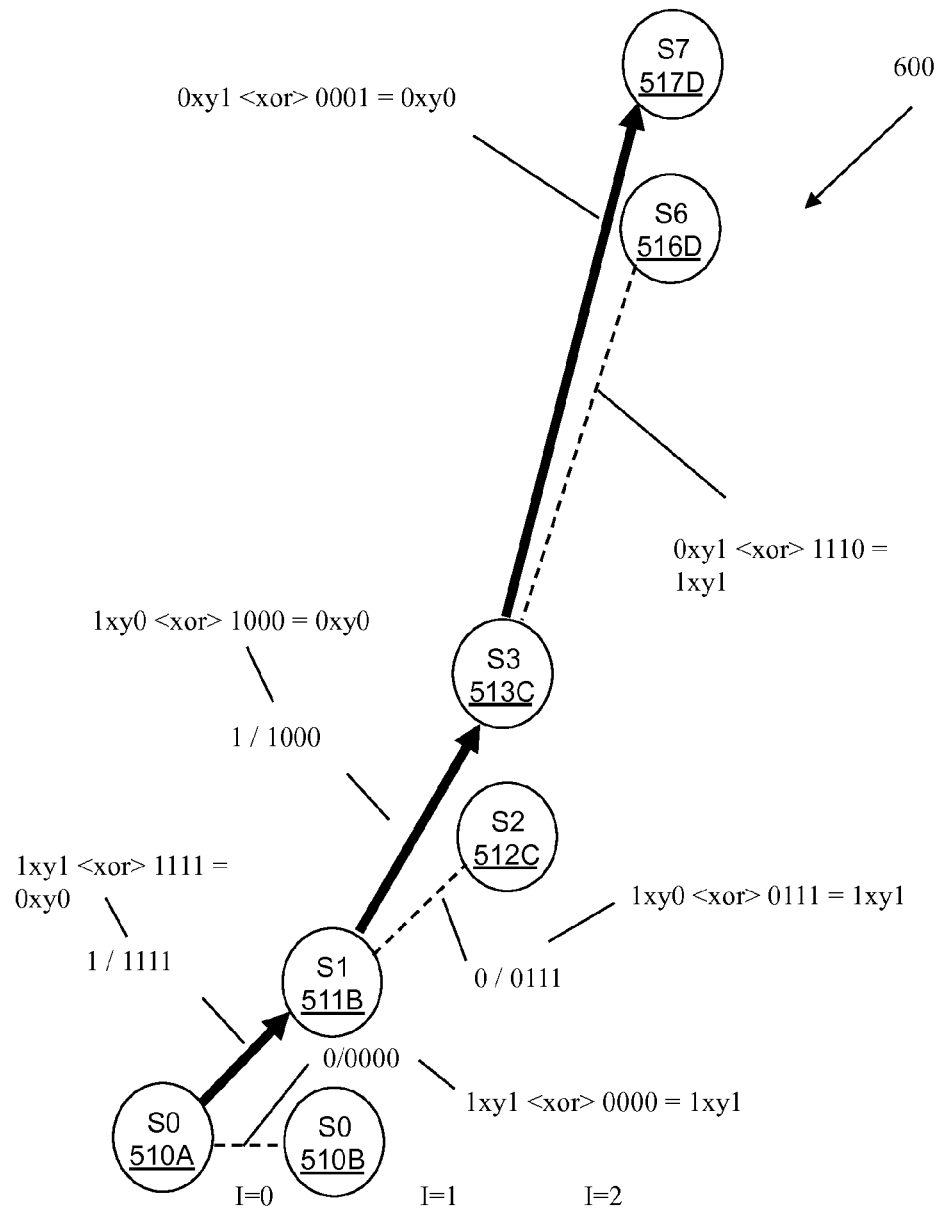
FIG. 6 illustrates a PRML path used to reconstruct missing data.

In the event that data in a layer becomes unreadable due to all or part of a recording layer becoming damaged, the present invention may be used to reconstruct the missing data. FIG. 6 and TABLE IV illustrate an example of the process of reconstructing missing data in accordance with the present invention. In the example, the data is entirely missing for layers L2 and L3. However, FIG. 6 uses PRML (minimum Hamming distance) to determine which path is the correct path through the trellis decoder diagram. For brevity, only 3 branches of the data recovery are analyzed.

The first branch (I=0) of data recovery comprises finding the correct data-recovery path for the data 1xy1, where x and y represent unknown encoded data because layers L2 and L3 are entirely missing. The Hamming distance from $S_0$ to $S_0$ is 1xy1<XOR>0000=1xy1, while the Hamming distance $S_0$ to $S_1$ is 1xy1<XOR>1111=1xy0. Because the path from $S_0$ to $S_1$ has the smaller Hamming distance, it is the correct path and the missing data for branch I=0 may be reconstructed as x=1 and y=1.

Similarly, the second branch (I=1) of data recovery comprises finding the correct data-recovery path for the data 1xy0. The Hamming distance from $S_1$ to $S_2$ is 1xy0<XOR>0111=1xy1, while the Hamming distance $S_1$ to $S_3$ is 1xy0<XOR>1000=0xy0. Because the path from $S_1$ to $S_3$ has the smaller Hamming distance, it is the correct path, and the missing data for branch I=2 may be reconstructed as x=y=0.

Finally, the third branch (I=2) of data recovery comprises finding the correct data-recovery path for the data 0xy1. The Hamming distance from $S_3$ to $S_6$ is 0xy1<XOR>1110=1xy1, while the Hamming distance $S_3$ to $S_7$ is to is 0xy1<XOR>0001=0xy0. Because the path from $S_3$ to $S_7$ has the smaller Hamming distance, it is the correct path.

TABLE IV

| Original Data U | Branch | Read encoded data L1, L2, L3, L4 | Correct Path | Rejected Path | Recovered Data Array L1, L2, L3, L4 | Decoded Data U |
|---|---|---|---|---|---|---|
| 1 | I = 0 | 1xy1 | S0 -> S1 | S0 -> S0 | 1111 | 1 |
| 1 | I = 1 | 1xy0 | S1 -> S3 | S1 -> S2 | 1000 | 1 |
| 1 | I = 2 | 0xy1 | S3 -> S7 | S3 -> S6 | 0001 | 1 |

Other encoding/decoding algorithms may also be used to implement the present invention. One such algorithm is a Reed-Solomon code, a form of random, error-correcting, cyclic code often used for multiple error corrections and based on the finite arithmetic of a Galois Field $GF(2^m)$. A Galois Field for m=4 is denoted as $GF(2^4)$. The elements of this field are $\{0, 1, \alpha, \alpha^2, \alpha^3, \alpha^4, \alpha^5, \alpha^6, \alpha^7, \alpha^8, \alpha^9, \alpha^{10}, \alpha^{11}, \alpha^{12}, \alpha^{13}, \alpha^{14}\}$. To multiply two elements $\alpha^i$ and $\alpha^j$, their exponents are added and use is made of the fact that $\alpha^{15}$ equals 1. For example, $\alpha^{12}*\alpha^7=\alpha^{19}=\alpha^{15}\alpha^4=\alpha^4$. Three representations for the elements of $GF(2^4)$ generated by $p(X)=1+X+X^4$ are shown in TABLE V.

TABLE V

| Power representation | Polynomial representation | 4-tuple representation |
|---|---|---|
| 0 | 0 | (0000) |
| 1 | 1 | (1000) |
| a | a | (0100) |
| $a^2$ | $a^2$ | (0010) |
| $a^3$ | $a^3$ | (0001) |
| $a^4$ | $1 + a$ | (1100) |
| $a^5$ | $a + a^2$ | (0110) |
| $a^6$ | $a^2 + a^3$ | (0011) |
| $a^7$ | $1 + a + a^3$ | (1101) |
| $a^8$ | $1 + a^2$ | (1010) |
| $a^9$ | $a + a^3$ | (0101) |
| $a^{10}$ | $1 + a + a^2$ | (1110) |
| $a^{11}$ | $a + a^2 + a^3$ | (0111) |
| $a^{12}$ | $1 + a + a^2 + a^3$ | (1111) |
| $a^{13}$ | $1 + a^2 + a^3$ | (1011) |
| $a^{14}$ | $1 + a^3$ | (1001) |

To add two elements $\alpha^i$ and $\alpha^j$ in $GF(2^4)$, their polynomial representations in the above table are used. For example:

$$\alpha^5+\alpha^7=(\alpha+\alpha^2)+(1+\alpha+\alpha^3)=1+\alpha^2+\alpha^3=\alpha^{13}$$

The generator polynomial for a Reed-Solomon encoder which corrects t symbold is:

$$g(X)=(X+\alpha)(X+\alpha^2)(X+\alpha^3)\ldots(X+\alpha^{2t})$$

To better understand such a generator polynomial, for a Reed-Solomon encoder which corrects t=3 symbols from $GF(2^4)$, as shown in TABLE V, the example generator polynomial is:

$$g(X)=(X+\alpha)(X+\alpha^2)(X+\alpha^3)(X+\alpha^4)(X+\alpha^5)(X+\alpha^6)$$

$$g(X)=\alpha^6+\alpha^9X+\alpha^6X^2+\alpha^4X^3+\alpha^{14}X^4+\alpha^{10}X^5+X^6$$

Thus, a Reed-Solomon encoder may be used as an alternative embodiment to a convolution encoder to provide redundancy in data spread across a plurality of layers of storage media. A Reed-Solomon encoder has a block length of $n=2^m-1$, and 2t parity-check digits.

Figure 7:
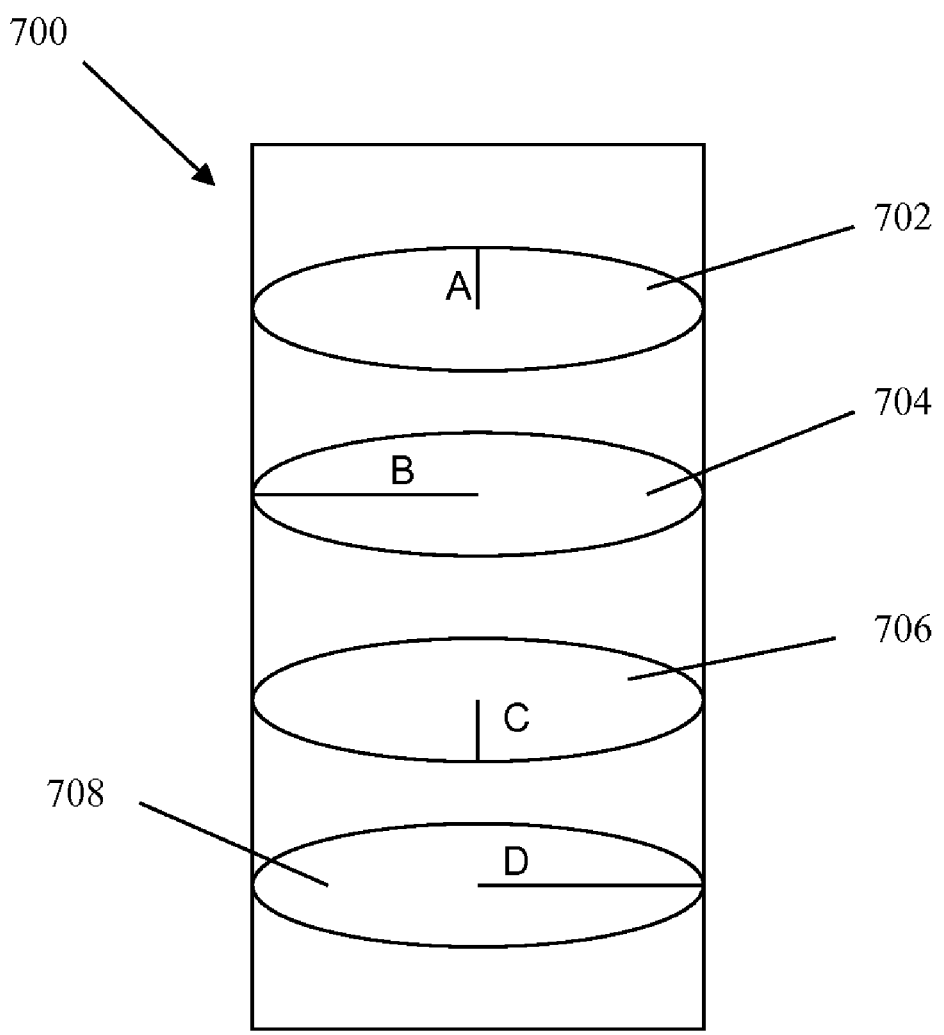
FIG. 7 illustrates a further embodiment of the present invention in which data is recorded on multiple layers with an angular offset.
Figure 8:
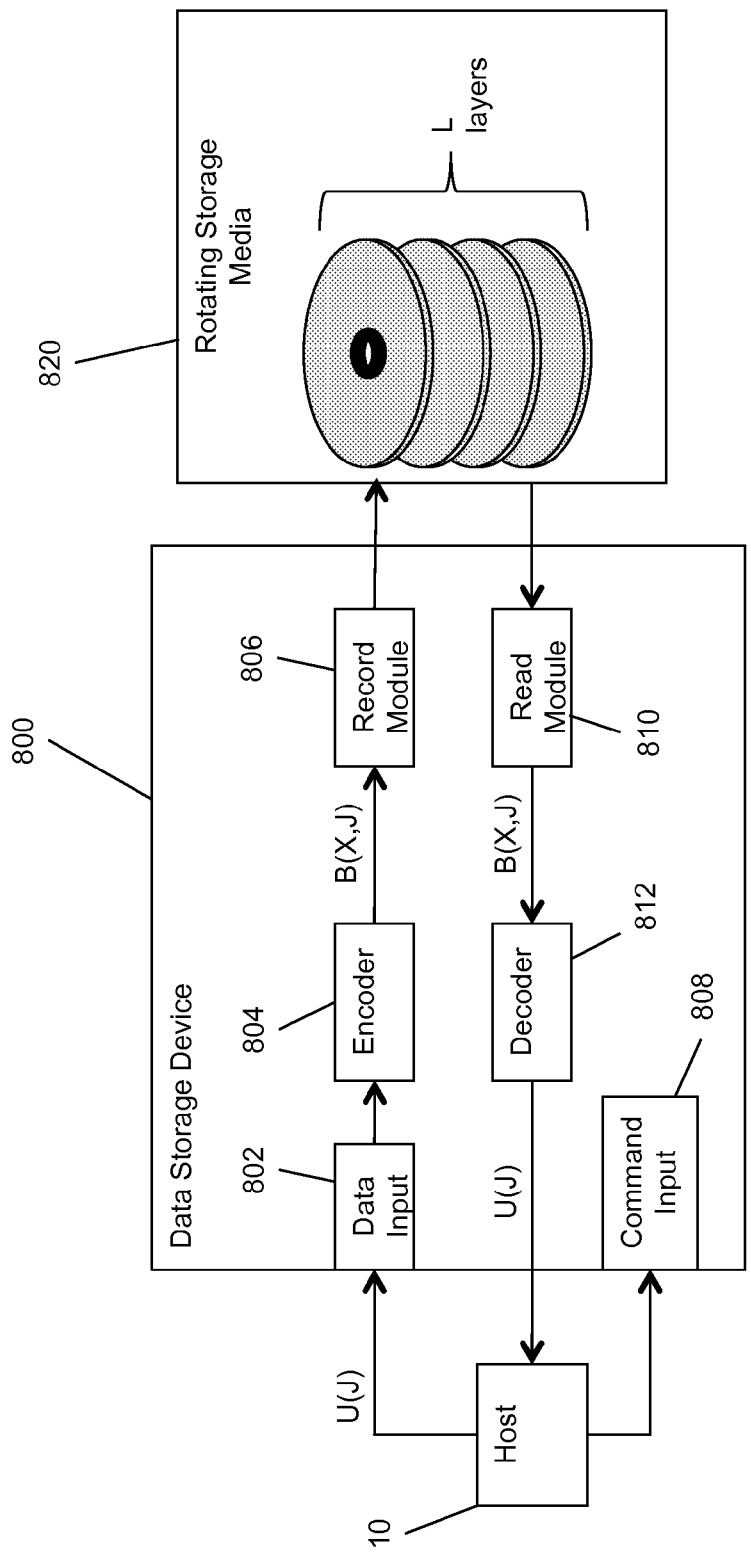
FIG. 8 illustrates a data storage device of the present invention.

Another feature of the present invention is illustrated in FIG. 7. A disc 700 includes four layers 702, 704, 706, 708. Rather than record four representation bits, encoded from a data bit, in vertical alignment from one layer to the next (that is, with the same starting address for each layer), each representation bit is given a starting address such that it is recorded to a location on a layer which is angularly offset from the bits in adjacent layers. In FIG. 7, the offset is 90° as represented by the lines A, B, C and D on the first, second, third and fourth layers 702, 704, 706, 708, respectively. Other angular offsets may also be used. Thus, although a scratch or other defect on one layer, such as the top layer 702, may prevent representation bits from being read from a particular area of the layer, the other three representation bits in the array will not be obscured by the defect.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies regardless of the particular type of signal bearing media actually used to carry out the distribution. Examples of computer readable media include recordable-type media such as a floppy disk, a hard disk drive, a RAM, and CD-ROMs.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated. Moreover, although described above with respect to methods and systems, the need in the art may also be met with a computer program product containing instructions for recording data to and reading data from multiple layers of rotating storage media.

What is claimed is:

1. A method for recording data to and reading data from multiple layers of rotating storage media, comprising:
    receiving a data stream U to be recorded to rotating storage media having a plurality L of recordable layers, the data stream U comprising a sequence of data bits where U(J) represents the $J^{th}$ bit in the data stream U;
    encoding each data bit U(J) into X representation bits B(1, J), B(2,J), ... B(X,J);
    recording the first representation bit B(1,J) onto a first layer of the storage media, recording the second representation bit B(2,J) onto a second layer of the storage media, and recording the $L^{th}$ representation bit B(L,J) onto the $L^{th}$ layer of the storage media and repeating the process for each remaining representation bit such that the $L+1^{th}$ bit is recorded onto the first layer, the $L+2^{nd}$ bit is recorded onto the second layer and the $2L^{th}$ bit is recorded onto the $L^{th}$ layer;
    receiving a request from a host device to read the recorded data U from the storage media;
    reading back a plurality of the X representation bits B(1,J), B(2,J), ... B(X,J) from the storage media; and
    decoding the plurality of X representation bits B(1,J), B(2, J), ... B(X,J) into the original data bit U(J).

2. The method of claim 1, wherein:
    encoding each data bit U(J) into X representation bits B(1, J), B(2,J), ... B(X,J) comprises convolution encoding each data bit U(J); and
    decoding the plurality of X representation bits B(1,J), B(2, J), ... B(X,J) into the original data bit U(J) comprises executing a partial-response, maximum-likelihood ("PRML") decoding algorithm.

3. The method of claim 1, wherein:
encoding each data bit U(J) into X representation bits B(1, J), B(2,J), . . . B(X,J) comprises executing a Reed Solomon encoding algorithm; and
decoding the plurality X representation bits B(1,J), B(2,J), . . . B(X,J) into the original data bit U(J) comprises executing a Reed Solomon decoding algorithm.

4. The method of claim 1, wherein:
the number of representation bits X equals the number of recordable layers L;
the remaining representation bits comprise representation bits B(3,J) . . . B(X,J); and
recording the remaining representation bits comprises recording the remaining representation bits B(3,J) . . . B(X,J) onto third through $L^{th}$ layers of the storage media.

5. The method of claim 1, wherein:
X is a predefined integer multiple M of L;
the remaining representation bits comprise representation bits B(3,J) . . . B(X,J); and
recording the representation bits comprises:
grouping the representation bits B(1,J) . . . B(X,J) into M groups of L representation bits each;
recording the L representation bits B(1,J) . . . B(L,J) of the first group onto the 1st through $L^{th}$ layers, respectively, of the storage media; and
recording the L representation bits of each other group onto the 1st through $L^{th}$ layers, respectively, of the storage media.

6. The method of claim 1, further comprising encoding a plurality of data bits of the data stream U in parallel.

7. The method of claim 1, wherein the rotating storage media comprises an optical disc having L recordable layers.

8. The method of claim 1, wherein the rotating storage media comprises a hard disk stack having L recordable magnetic surfaces.

9. The method of claim 1, wherein recording the representation bits comprises recording each representation bit to a starting location on a respective layer which is angularly offset by a predetermined amount from the starting locations of representation bits on adjacent layers.

10. A data storage device operable to record data to and read data from multiple layers of rotating storage media, comprising:
a data input coupled to receive a data stream U to be recorded to rotating storage media having a plurality L of recordable layers, the data stream U comprising a sequence of data bits where U(J) represents the $J^{th}$ bit in the data stream U;
an encoder for encoding each data bit U(J) into X representation bits B(1,J), B(2,J), . . . B(X,J);
means for recording the first representation bit B(1,J) onto a first layer of the storage media, recording the second representation bit B(2,J) onto a second layer of the storage media, and recording the $L^{th}$ representation bit B(L, J) onto the L of the storage media and repeating the process for each remaining representation bit such that the L+1$^{th}$ bit is recorded onto the first layer, the L+2$^{nd}$ bit is recorded onto the second layer and the 2L$^{th}$ bit is recorded onto the $L^{th}$ layer;
a command input for receiving a request from a host device to read the recorded data U from the storage media;
means for reading back a plurality of the X representation bits B(1,J), B(2,J), . . . B(X,J) from the storage media; and a decoder for decoding the plurality X representation bits B(1,J), B(2,J), . . . B(X,J) into the original data bit U(J).

11. The data storage device of claim 10, wherein
the encoder comprises a convolution encoder; and
the decoder comprises a partial-response, maximum-likelihood ("PRML") decoder.

12. The data storage device of claim 11, wherein X=4 and the encoder comprises:
first, second and third shift registers coupled in series, each shift register having an input and an output, the input of the first shift register coupled to the data input;
first, second, third and fourth modulo-2 adders, each having an output for a corresponding one of the X representation bits, wherein:
the first adder has inputs coupled to the data input and the output of the first and third shift registers;
the second adder has inputs coupled to the data input and the outputs of the first and third shift register;
the third adder has inputs coupled to the data input and the outputs of the first and third shift register; and
the fourth adder has inputs coupled to the data input and the output of each shift register.

13. The data storage device of claim 11, wherein the decoder comprises a trellis decoder.

14. The data storage device of claim 10, wherein
the encoder comprises a Reed Solomon encoder; and
the decoder comprises a Reed Solomon decoder.

15. The data storage device of claim 10, wherein the rotating storage media comprises an optical disc having L recordable layers.

16. The data storage device of claim 10, wherein the rotating storage media comprises a hard disk stack having L recordable magnetic surfaces.

17. A computer program product of a computer readable medium usable with a programmable computer, the computer program product having computer-readable code embodied therein for recording data to and reading data from multiple layers of rotating storage media, the computer-readable code comprising instructions for:
receiving a data stream U to be recorded to rotating storage media having a plurality L of recordable layers, the data stream U comprising a sequence of data bits where U(J) represents the $J^{th}$ bit in the data stream U;
encoding each data bit U(J) into X representation bits B(1, J), B(2,J), . . . B(X,J);
recording the first representation bit B(1,J) onto a first layer of the storage media, recording the second representation bit B(2,J) onto a second layer of the storage media, and recording the $L^{th}$ representation bits-bit B(L,J) onto $L^{th}$ layer of the storage media and repeating the process for each remaining representation bit such that the L+1$^{th}$ bit is recorded onto the first layer, the L+2$^{nd}$ bit is recorded onto the second layer and the 2L$^{th}$ bit is recorded onto the $L^{th}$ layer;
receiving a request from a host device to read the recorded data U from the storage media;
reading back a plurality of the X representation bits B(1,J), B(2,J), . . . B(X,J) from the storage media; and
decoding the plurality of X representation bits B(1,J), B(2, J), . . . B(X,J) into the original data bit U(J).

18. The computer program product of claim 17, wherein:
the instructions for encoding comprise instructions for encoding each data bit U(J) into X representation bits B(1,J), B(2,J), . . . B(X,J) comprises convolution encoding each data bit U(J); and
the instructions for decoding comprise instructions for decoding the plurality of X representation bits B(1,J), B(2,J), ... B(X,J) into the original data bit U(J) comprises executing a partial-response, maximum-likelihood ("PRML") decoding algorithm.

19. The computer program product of claim 17, wherein:
X is a predefined integer multiple M of L;
the remaining representation bits comprise representation bits B(3,J) ... B(X,J); and
the instructions for recording the representation bits comprise instructions for:
  grouping the representation bits B(1,J) ... B(X,J) into M groups of L representation bits each;
  recording the L representation bits B(1,J) ... B(L,J) of the first group onto the 1st through $L^{th}$ layers, respectively, of the storage media; and
  recording the L representation bits of each other group onto the 1st through $L^{th}$ layers, respectively, of the storage media.

20. The computer program product of claim 17, wherein the rotating storage media comprises an optical disc having L recordable layers.

21. The computer program product of claim 17, wherein the rotating storage media comprises a hard disk stack having L recordable magnetic surfaces.

* * * * *